US008410690B2

(12) United States Patent
Natarajan et al.

(10) Patent No.: US 8,410,690 B2
(45) Date of Patent: Apr. 2, 2013

(54) DISPLAY DEVICE WITH DESICCANT

(75) Inventors: Bangalore R. Natarajan, Cupertino, CA (US); Evgeni Gousev, Saratoga, CA (US); Kristopher A. Lavery, San Jose, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 983 days.

(21) Appl. No.: 12/371,302

(22) Filed: Feb. 13, 2009

(65) Prior Publication Data

US 2010/0206629 A1 Aug. 19, 2010

(51) Int. Cl.
*B01J 20/00* (2006.01)

(52) U.S. Cl. ........................................ 313/512; 502/400

(58) Field of Classification Search .................. 502/400, 502/405, 414, 416, 417; 313/498–512
See application file for complete search history.

(56) References Cited

U.S. PATENT DOCUMENTS 3,586,926 A 6/1971 Nakamura et al.
4,036,360 A 7/1977 Deffeyes
4,074,480 A 2/1978 Burton
4,531,126 A 7/1985 Sadones
4,844,614 A 7/1989 Henderson et al.
4,977,009 A 12/1990 Anderson et al.
4,983,824 A 1/1991 Saaski et al.
5,244,707 A 9/1993 Shores
5,304,419 A 4/1994 Shores
5,501,744 A * 3/1996 Albright et al. ............... 136/258
5,550,373 A 8/1996 Cole et al.
5,559,358 A 9/1996 Burns et al.
5,591,379 A 1/1997 Shores
5,610,438 A 3/1997 Wallace et al.
5,614,785 A 3/1997 Wallace et al.
5,882,761 A 3/1999 Kawami et al.
5,936,758 A 8/1999 Fisher et al.
5,939,785 A 8/1999 Klonis et al.
6,031,657 A 2/2000 Robinson et al.

(Continued)

FOREIGN PATENT DOCUMENTS

DE 102 24 780 12/2003
EP 0 969 700 1/2000

(Continued)

OTHER PUBLICATIONS

IPRP dated Aug. 11, 2011 in PCT/US10/022281.

(Continued)

*Primary Examiner* — Anne Hines
(74) *Attorney, Agent, or Firm* — Knobbe Martens Olson & Bear LLP

(57) ABSTRACT

Systems and methods for providing MEMS devices with integrated desiccant are provided. In one embodiment, a dry composition comprising desiccant is impact sprayed onto the backplate or substrate of a MEMS device, and becomes fused with the substrate. In another embodiment, the desiccant is impact sprayed such that the desiccant adheres to the impact sprayed surface. In yet another embodiment, the impact-sprayed surface is impregnated with the desiccant. In still another embodiment, the desiccant is combined with a suitable inorganic binder, then impact sprayed such that the desiccant adheres to the impact sprayed surface. In yet a further embodiment, the desiccant is micronized or pulverized into a powder of desired particle size, and then impact sprayed onto a surface. Thus, the desiccant particles or powder are fused onto the target surface through the impact spraying process.

47 Claims, 11 Drawing Sheets

U.S. PATENT DOCUMENTS

| | | | |
|---|---|---|---|
| 6,040,937 | A | 3/2000 | Miles |
| 6,226,890 | B1 | 5/2001 | Boroson et al. |
| 6,261,853 | B1 | 7/2001 | Howell et al. |
| 6,284,342 | B1 | 9/2001 | Ebisawa et al. |
| 6,379,988 | B1 | 4/2002 | Peterson et al. |
| 6,392,144 | B1 | 5/2002 | Filter et al. |
| 6,445,062 | B1 | 9/2002 | Honda |
| 6,472,739 | B1 | 10/2002 | Wood et al. |
| 6,474,138 | B1 | 11/2002 | Chang et al. |
| 6,551,838 | B2 | 4/2003 | Santini et al. |
| 6,589,625 | B1 | 7/2003 | Kothari et al. |
| 6,590,157 | B2 | 7/2003 | Boroson et al. |
| 6,650,455 | B2 | 11/2003 | Miles |
| 6,661,084 | B1 | 12/2003 | Peterson et al. |
| 6,674,159 | B1 | 1/2004 | Peterson et al. |
| 6,674,562 | B1 | 1/2004 | Miles et al. |
| 6,680,792 | B2 | 1/2004 | Miles |
| 6,696,645 | B2 | 2/2004 | Margomenos et al. |
| 6,740,145 | B2 | 5/2004 | Boroson et al. |
| 6,787,897 | B2 | 9/2004 | Geefay et al. |
| 6,791,660 | B1 | 9/2004 | Hayashi et al. |
| 6,876,071 | B2 | 4/2005 | Liu et al. |
| 7,011,986 | B2 | 3/2006 | Daeche et al. |
| 7,042,643 | B2 | 5/2006 | Miles |
| 7,045,885 | B1 | 5/2006 | Chen et al. |
| 7,060,895 | B2 | 6/2006 | Kothari et al. |
| 7,123,216 | B1 | 10/2006 | Miles |
| 7,161,094 | B2 | 1/2007 | Kothari et al. |
| 7,164,520 | B2 | 1/2007 | Palmateer et al. |
| 7,218,438 | B2 | 5/2007 | Przybyla et al. |
| 7,315,115 | B1 | 1/2008 | Curtin et al. |
| 7,327,510 | B2 | 2/2008 | Cummings et al. |
| 7,368,803 | B2 | 5/2008 | Gally et al. |
| 7,405,924 | B2 | 7/2008 | Gally et al. |
| 7,443,563 | B2 | 10/2008 | Palmateer et al. |
| 7,550,912 | B2 | 6/2009 | Chui |
| 7,551,246 | B2 | 6/2009 | Palmateer |
| 7,746,537 | B2 | 6/2010 | Natarajan |
| 2002/0056900 | A1 | 5/2002 | Liu et al. |
| 2002/0063322 | A1 | 5/2002 | Robbins et al. |
| 2002/0075551 | A1 | 6/2002 | Daneman |
| 2002/0075555 | A1 | 6/2002 | Miles |
| 2002/0119724 | A1 | 8/2002 | Hammel |
| 2002/0149096 | A1 | 10/2002 | Liebeskind |
| 2003/0054588 | A1 | 3/2003 | Patel et al. |
| 2003/0062186 | A1 | 4/2003 | Boroson et al. |
| 2003/0075794 | A1 | 4/2003 | Felton et al. |
| 2003/0108306 | A1 | 6/2003 | Whitney et al. |
| 2003/0121418 | A1 | 7/2003 | Loop et al. |
| 2003/0122137 | A1 | 7/2003 | Hashimoto |
| 2003/0138656 | A1 | 7/2003 | Sparks |
| 2003/0160021 | A1 | 8/2003 | Platt et al. |
| 2003/0167798 | A1 | 9/2003 | Borrelli et al. |
| 2003/0184412 | A1 | 10/2003 | Gorrell |
| 2004/0051929 | A1 | 3/2004 | Sampsell et al. |
| 2004/0061492 | A1 | 4/2004 | Lopes et al. |
| 2004/0080035 | A1 | 4/2004 | Delapierre |
| 2004/0100677 | A1 | 5/2004 | Huibers et al. |
| 2004/0115856 | A1 | 6/2004 | Jung et al. |
| 2004/0122175 | A1 | 6/2004 | Hekal |
| 2004/0140557 | A1 | 7/2004 | Sun et al. |
| 2004/0166603 | A1 | 8/2004 | Carley |
| 2004/0184133 | A1 | 9/2004 | Su et al. |
| 2004/0189195 | A1 | 9/2004 | Allemand |
| 2004/0191568 | A1 | 9/2004 | Ohshita et al. |
| 2004/0213962 | A1 | 10/2004 | Bourdelais et al. |
| 2004/0259370 | A1 | 12/2004 | Bergman |
| 2005/0074919 | A1 | 4/2005 | Patel et al. |
| 2005/0093134 | A1 | 5/2005 | Tarn |
| 2005/0253283 | A1 | 11/2005 | Dcamp et al. |
| 2005/0269926 | A1* | 12/2005 | Fukuoka et al. .............. 313/123 |
| 2006/0066600 | A1 | 3/2006 | Palmateer |
| 2006/0066932 | A1 | 3/2006 | Chui et al. |
| 2006/0076632 | A1 | 4/2006 | Palmateer et al. |
| 2006/0076637 | A1 | 4/2006 | Gally |
| 2006/0077126 | A1 | 4/2006 | Kothari |
| 2006/0077145 | A1 | 4/2006 | Floyd |
| 2006/0077147 | A1 | 4/2006 | Pamateer et al. |
| 2006/0077503 | A1 | 4/2006 | Palmateer et al. |
| 2006/0163711 | A1 | 7/2006 | Roels |
| 2006/0244376 | A1* | 11/2006 | Chun et al. .................... 313/506 |
| 2007/0041076 | A1 | 2/2007 | Zhong et al. |
| 2007/0268201 | A1 | 11/2007 | Sampsell |
| 2007/0268581 | A1 | 11/2007 | Palmateer |
| 2008/0112036 | A1 | 5/2008 | Cummings |
| 2008/0130082 | A1 | 6/2008 | Kothari et al. |
| 2008/0164544 | A1 | 7/2008 | Palmateer et al. |
| 2008/0272446 | A1 | 11/2008 | Haluzak et al. |
| 2010/0025832 | A1* | 2/2010 | Atnip et al. ................... 257/682 |
| 2010/0172013 | A1 | 7/2010 | Palmateer |
| 2011/0012219 | A1 | 1/2011 | Lin et al. |
| 2011/0053304 | A1 | 3/2011 | Palmateer et al. |
| 2012/0235970 | A1 | 9/2012 | Lavery et al. |

FOREIGN PATENT DOCUMENTS

| | | |
|---|---|---|
| EP | 1 220 010 | 7/2002 |
| EP | 1 251 546 | 10/2002 |
| EP | 1 418 154 | 5/2004 |
| JP | 2003-179197 | 6/2003 |
| JP | 2003-217828 | 7/2003 |
| WO | WO 02/39513 | 5/2002 |
| WO | WO 02/42716 | 5/2002 |
| WO | WO 02/093240 | 11/2002 |
| WO | WO 03/009317 | 1/2003 |
| WO | WO 03/026369 | 3/2003 |
| WO | WO 03/056367 | 7/2003 |

OTHER PUBLICATIONS

ISR and WO dated Feb. 24, 2011 in PCT/US10/022281.

Keusseyan et al., A new approach for opto-electronic/MEMS packaging, Proceedings 52nd Electronic Components and Technology Conference, ECTC May 2002, pp. 259-262.

Liang, Zhi-Hao et al., "A Low Temperature Wafer-Level Hermetic MEMS Package Using UV Curable Adhesive", Electronic Components and Technology Conference, 2004 IEEE, pp. 1486-1491.

Miles, Mark, W., "A New Reflective FPD Technology Using Interferometric Modulation", The Proceedings of the Society for Information Display (May 11-16, 1997).

Moraja, et al., Advanced Getter Solutions at Wafer Level to Assure High Reliability to the last Generations MEMS, IEEE Reliability Physics Symposium Proceedings, 2003, pp. 458-459.

Previti et al., Getters: micromolecular scavengers for packaging, Proceedings International Symposium on Advanced Packaging Materials Processes, Properties and Interfaces, 2001, pp. 201-206.

Sparks, et al. Chip-Level Vacuum Packaging of Micromachines Using NanoGetters, IEEE Transactions on Advanced Packaging, vol. 26 Issue 3, Aug. 2003, pp. 277-282.

Official Communication dated Aug. 23, 2012 in European app. No. 10703561.0.

* cited by examiner

| | | Column Output Signals | |
|---|---|---|---|
| | | $+V_{bias}$ | $-V_{bias}$ |
| Row Output Signals | 0 | Stable | Stable |
| | $+\Delta V$ | Relax | Actuate |
| | $-\Delta V$ | Actuate | Relax |

Plain Glass Impact Sprayed with Synthetic 3A Zeolite

DISPLAY DEVICE WITH DESICCANT

BACKGROUND

1. Field of the Invention

The field of the invention relates to microelectromechanical systems (MEMS) and organic light-emitting diode (OLED) devices, and more particularly, to methods and systems for packaging MEMS and OLED devices.

2. Description of Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

Desiccants are commonly used in MEMS and OLED devices to keep the internal environment of the display device dry during the device's operational lifetime. The desiccant may be in different forms, shapes, and sizes. For example, materials like CaO and zeolites may be used in the form of a thin patch or a thin hardened paste to absorb moisture inside the device package. The materials can be attached to a surface in the display device, such as a backplate, with pressure sensitive adhesive, for example. Patches and pastes are applied with a typical thickness of 80-200 microns. These patches and pastes therefore constrain the minimum thickness of the device, because sufficient room must be provided for both the desiccant and movable element(s) inside the display device package. To make room for patch or paste desiccants without substantially increasing the thickness of the display package, additional manufacturing steps may be employed. A cavity may be chemically etched into a display substrate, for example, so that desiccant can be deposited in the manufactured cavity.

The effectiveness of patch and paste desiccants is also limited because such desiccants are delivered with a binder in the form of a matrix, whereby, for example, a Teflon binder includes 15 to 20% embedded desiccant. Using a binder or solvent to apply a desiccant to a surface is not optimal in the presence of sensitive MEMS components, however, as the binder or solvent can release contaminants into the display package as it evaporates. Use of solution processing to apply a desiccant also results in outgassing of contaminant gasses inside the display package.

The efficacy of patch and paste desiccants is further limited because they are not applied uniformly across an entire surface in the display device package. They are typically attached such that they cover one region of a surface in the display device, leaving other regions uncovered. The presence of the desiccant on some areas and not others, and the proximity of the desiccant to sensitive interferometric modulator components, can impair the electromechanical behavior of the modulator and degrade device performance.

The continued reduction in display device dimensions restricts available methods to manage the environment within the display device package because there is less area to place a desiccant within the package structure. Although the area of a packaging structure susceptible to influx of water vapor may remain the same or be slightly reduced as package structures are reduced in size, the area available for a desiccant is reduced dramatically in comparison.

SUMMARY OF CERTAIN EMBODIMENTS

One embodiment is an electronic device package. The package includes a first substrate having an electronic device; a backplate cover sealing the electronic device within a package between the first substrate and the backplate cover; and a desiccant fused onto at least a portion of the backplate cover or first substrate. In one embodiment, the desiccant is a substantially dry zeolite material. In another embodiment, the zeolite material has a pore size of approximately 3 angstroms, or alternatively, between approximately 3 to 10 angstroms. In yet another embodiment, the backplate cover or first substrate include a layer of desiccant with a thickness between approximately 0.5 to 5.0 microns.

Another embodiment is a method of manufacturing an electronic device. The method includes providing a first substrate having an electronic device; providing a backplate cover; fusing a desiccant onto a portion of the backplate cover or first substrate; and joining the backplate cover to the first substrate to form an electronic device. In one embodiment, fusing the desiccant includes impact spraying the desiccant. In another embodiment, the method includes providing a mask on the backplate cover for selectively impact spraying a portion of the backplate cover with the desiccant. In yet another embodiment, fusing the desiccant includes plasma spraying the desiccant.

Still another embodiment is an electronic display that includes means for supporting a display device; means for covering the display device to form a package; and means for desiccating the package, wherein the desiccating means has desiccant that is fused onto the covering means.

Yet another embodiment is a package that includes a first surface sealed to a second surface, and a desiccant fused onto at least a portion of a surface inside the package. Another embodiment is a method of adhering desiccant to a surface. The method includes impact spraying desiccant onto the surface, such that the desiccant becomes fused to the surface. In still another embodiment, a surface comprising fused desiccant is provided.

DETAILED DESCRIPTION

Figure 1:
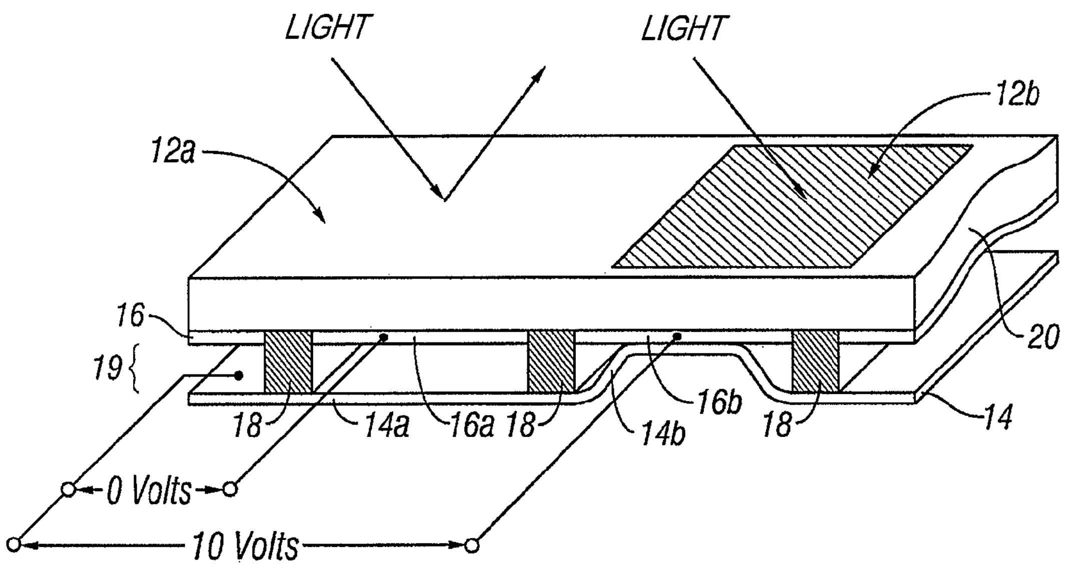
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

The following detailed description is directed to certain specific embodiments. However, the teachings herein can be applied in a multitude of different ways. In this description, reference is made to the drawings wherein like parts are designated with like numerals throughout. The embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Embodiments relate to systems and methods for providing MEMS devices with integrated desiccant. In one embodiment, a dry composition comprising desiccant is impact sprayed onto the backplate or substrate of a MEMS device. In this embodiment, the desiccant can become fused with the substrate. In one embodiment the desiccant is impact sprayed such that the desiccant adheres to the impact sprayed surface. In another embodiment, the impact-sprayed surface is impregnated with the desiccant. In yet another embodiment, the desiccant is combined with a suitable inorganic binder, then impact sprayed such that the desiccant adheres to the impact sprayed surface. In still another embodiment, the desiccant is micronized or pulverized into a powder of desired particle size, and then impact sprayed onto a surface. Thus, the desiccant particles or powder are fused onto the target surface through the impact spraying process. Without being bound to any particular theory, it is believed that contacting a relatively dry desiccant composition under velocity or pressure results in the desiccant melting and fusing to a target surface. This differs from other techniques, such as layering a relatively wet desiccant and waiting for the desiccant to dry into a layer. This drying process results in a layer of desiccant that is on top of a surface, but fairly easy to remove, whereas desiccant that is fused to a surface can be put down in very thin layers as described below.

In some embodiments, fusing desiccant creates a desiccant layer with a greater surface area in comparison to a desiccant that is merely layered on in a flat coating. Moreover, due to the forces involved in impact spraying a desiccant onto a surface as described below, more purified forms of the desiccant can be used in embodiments described herein. Thus, the desiccating properties of the impact-sprayed desiccant can be greater per square millimeter in comparison to desiccant that is not impact-sprayed.

One interferometric modulator display embodiment comprising an interferometric MEMS display element is illustrated in FIG. 1. In these devices, the pixels are in either a bright or dark state. In the bright ("relaxed" or "open") state, the display element reflects a large portion of incident visible light to a user. When in the dark ("actuated" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12*a* and 12*b*. In the interferometric modulator 12*a* on the left, a movable reflective layer 14*a* is illustrated in a relaxed position at a predetermined distance from an optical stack 16*a*, which includes a partially reflective layer. In the interferometric modulator 12*b* on the right, the movable reflective layer 14*b* is illustrated in an actuated position adjacent to the optical stack 16*b*.

The optical stacks 16*a* and 16*b* (collectively referred to as optical stack 16), as referenced herein, typically comprise several multi-layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14*a*, 14*b* may be formed as a series of parallel strips of a deposited metal layer or layers (orthogonal to the row electrodes of 16*a*, 16*b*) to form columns deposited on top of posts 18 and an intervening sacrificial material deposited between the posts 18. When the sacrificial material is etched away, the movable reflective layers 14*a*, 14*b* are separated from the optical stacks 16*a*, 16*b* by a defined gap 19. A highly conductive and reflective material such as aluminum may be used for the reflective layers 14, and these strips may form column electrodes in a display device. Note that FIG. 1 may not be to scale. In some embodiments, the spacing between posts 18 may be on the order of 10-100 um, while the gap 19 may be on the order of <1000 Angstroms.

With no applied voltage, the gap 19 remains between the movable reflective layer 14*a* and optical stack 16*a*, with the movable reflective layer 14*a* in a mechanically relaxed state, as illustrated by the pixel 12*a* in FIG. 1. However, when a potential (voltage) difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by actuated pixel 12*b* on the right in FIG. 1. The behavior is the same regardless of the polarity of the applied potential difference.

FIGS. 2 through 5 illustrate one exemplary process and system for using an array of interferometric modulators in a display application.

Figure 2:
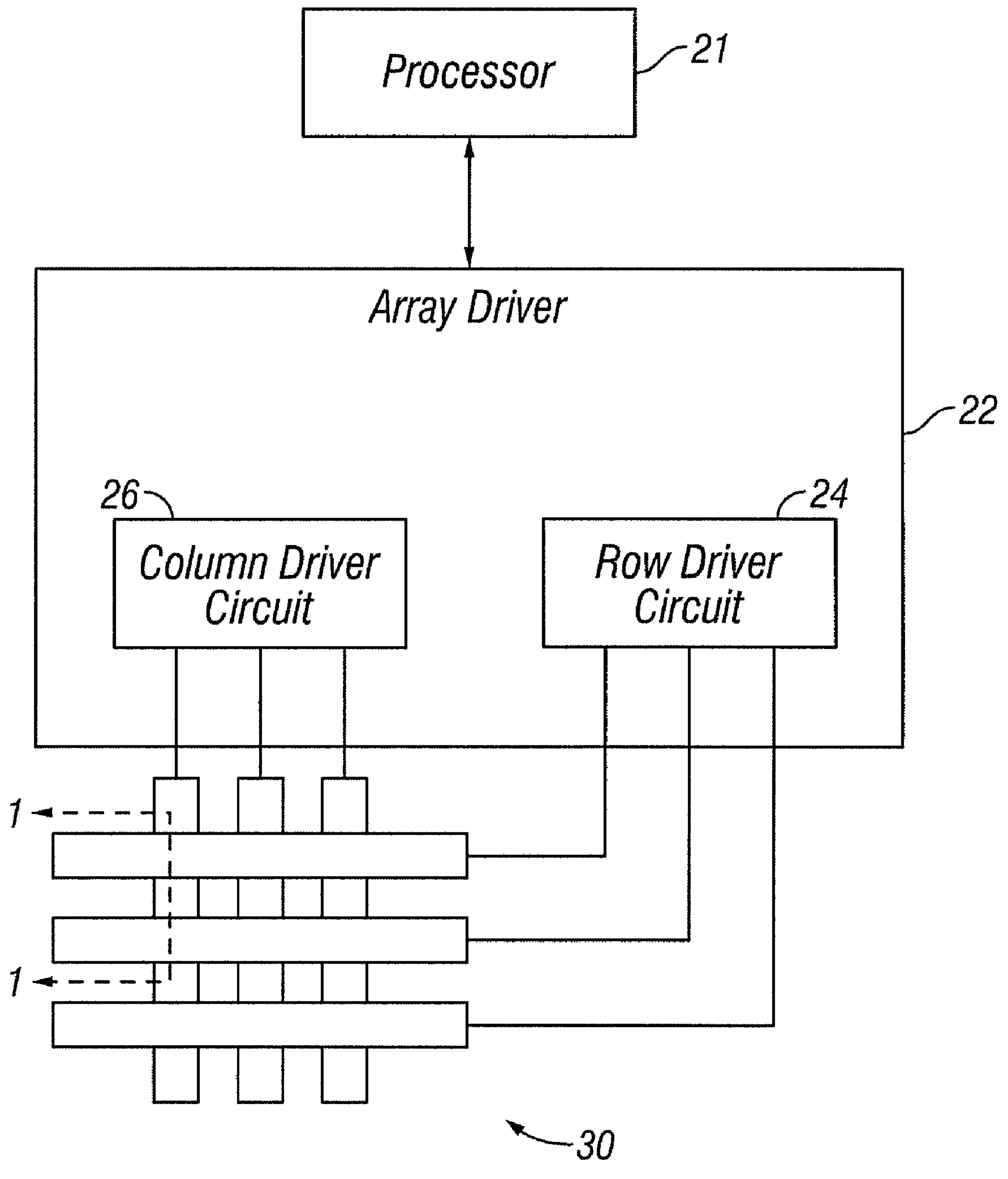
FIG. 2 is a system block diagram illustrating one embodiment of an electronic device incorporating a 3×3 interferometric modulator display.

FIG. 2 is a system block diagram illustrating one embodiment of an electronic device that may incorporate interferometric modulators. The electronic device includes a processor 21 which may be any general purpose single- or multi-chip microprocessor such as an ARM®, Pentium®, 8051, MIPS®, Power PC®, or ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. Note that although FIG. 2 illustrates a 3×3 array of interferometric modulators for the sake of clarity, the display array 30 may contain a very large number of interferometric modulators, and may have a different number of interferometric modulators in rows than in columns (e.g., 300 pixels per row by 190 pixels per column).

Figures 3, 4:
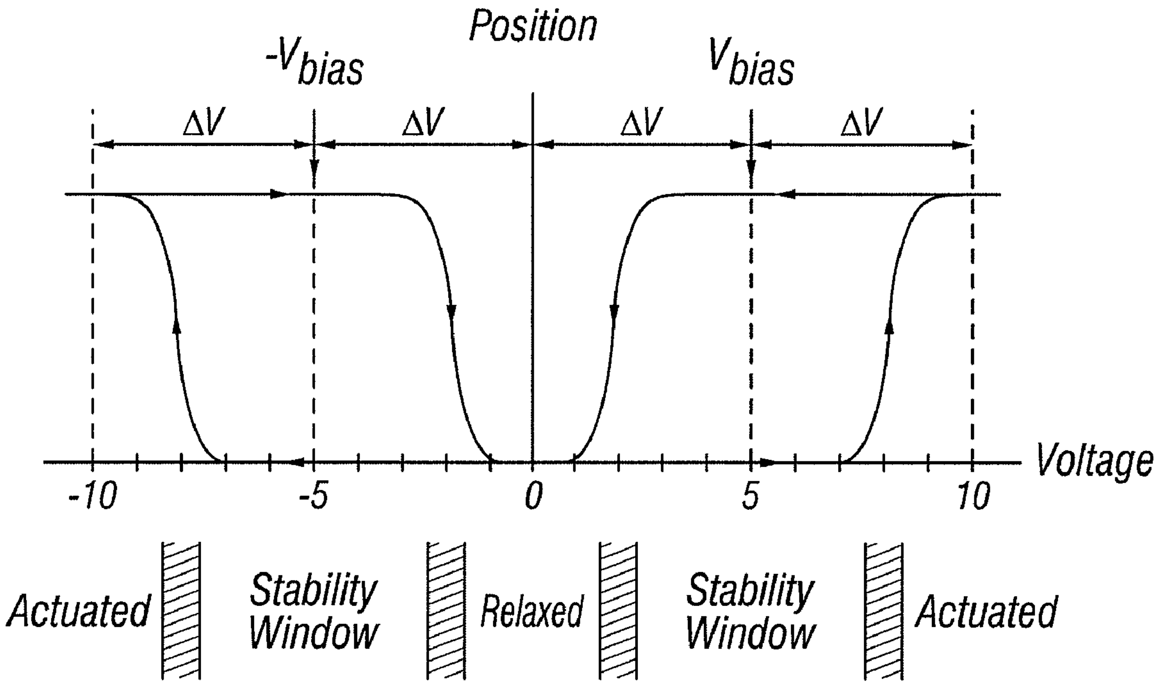
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIG. 3 is a diagram of movable mirror position versus applied voltage for one exemplary embodiment of an interferometric modulator of FIG. 1. For MEMS interferometric modulators, the row/column actuation protocol may take advantage of a hysteresis property of these devices as illustrated in FIG. 3. An interferometric modulator may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state or bias voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

As described further below, in typical applications, a frame of an image may be created by sending a set of data signals (each having a certain voltage level) across the set of column electrodes in accordance with the desired set of actuated pixels in the first row. A row pulse is then applied to a first row electrode, actuating the pixels corresponding to the set of data signals. The set of data signals is then changed to correspond to the desired set of actuated pixels in a second row. A pulse is then applied to the second row electrode, actuating the appropriate pixels in the second row in accordance with the data signals. The first row of pixels are unaffected by the second row pulse, and remain in the state they were set to during the first row pulse. This may be repeated for the entire series of rows in a sequential fashion to produce the frame. Generally, the frames are refreshed and/or updated with new image data by continually repeating this process at some desired number of frames per second. A wide variety of protocols for driving row and column electrodes of pixel arrays to produce image frames may be used.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
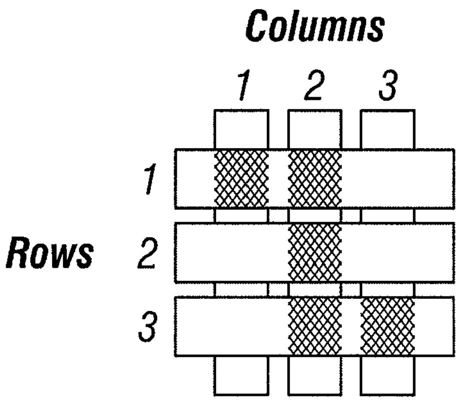
FIGS. 5A and 5B illustrate one exemplary timing diagram for row and column signals that may be used to write a frame of display data to the 3×3 interferometric modulator display of FIG. 2.
Figure 5B:
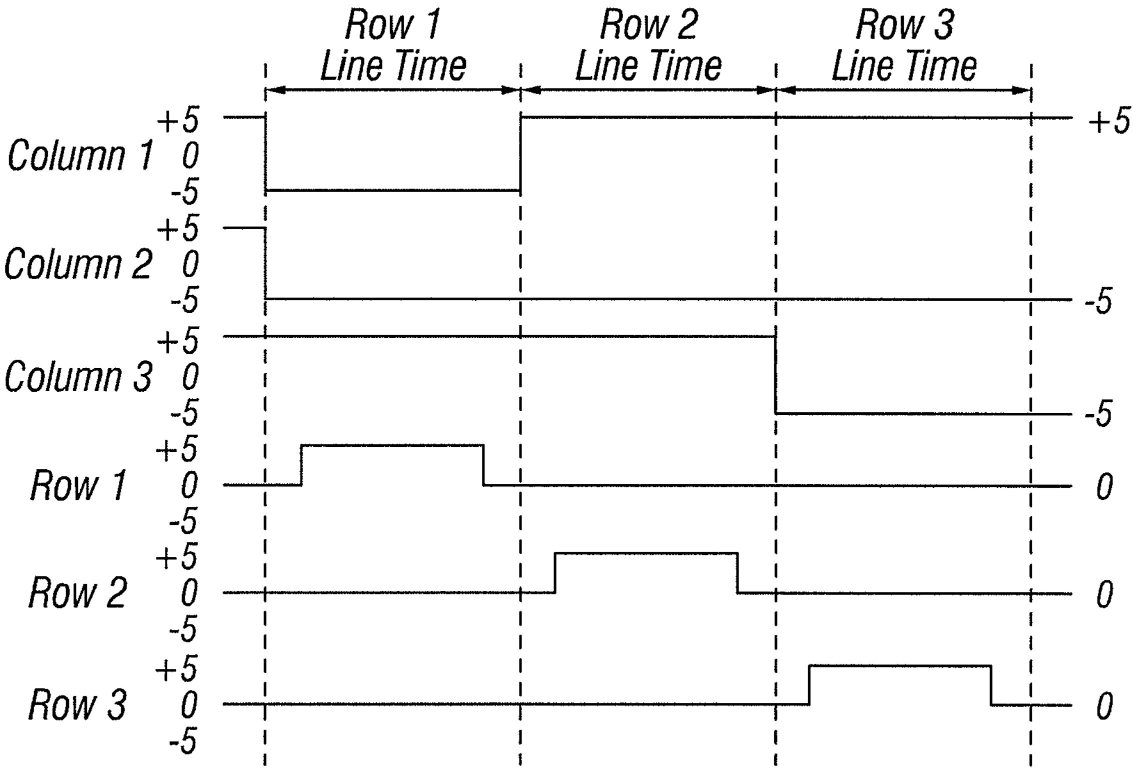

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are initially at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. The same procedure can be employed for arrays of dozens or hundreds of rows and columns. The timing, sequence, and levels of voltages used to perform row and column actuation can be varied widely within the general principles outlined above, and the above example is exemplary only, and any actuation voltage method can be used with the systems and methods described herein.

Figure 6A:
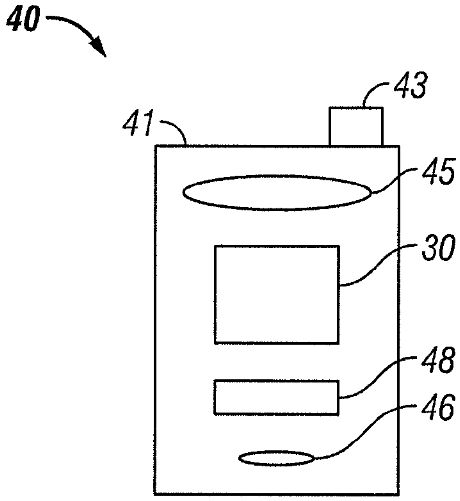
FIGS. 6A and 6B are system block diagrams illustrating an embodiment of a visual display device comprising a plurality of interferometric modulators.
Figure 6B:
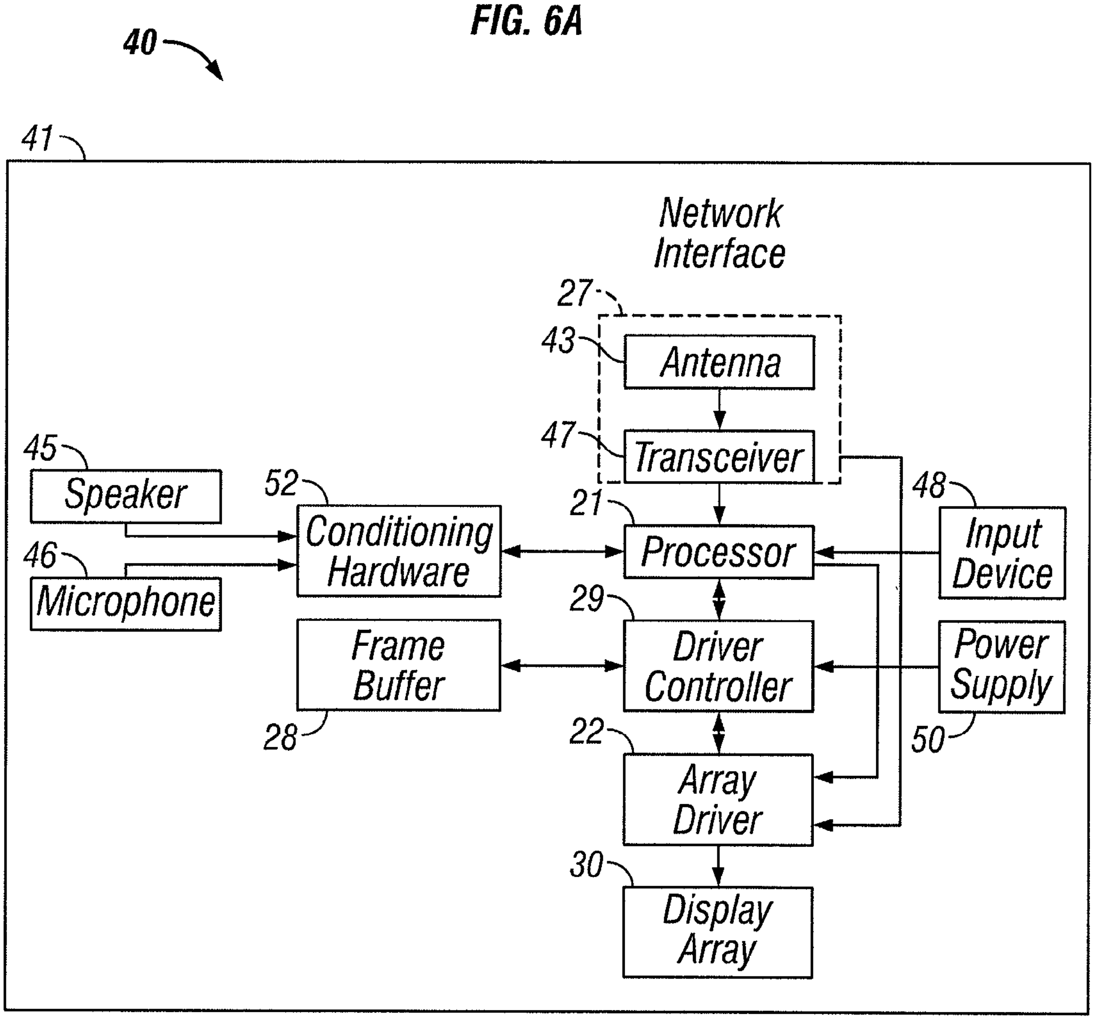

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one ore more devices over a network. In one embodiment the network interface 27 may also have some processing capabilities to relieve requirements of the processor 21. The antenna 43 is any antenna for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, W-CDMA, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. The above-described optimization may be implemented in any number of hardware and/or software components and in various configurations.

Figure 7A:
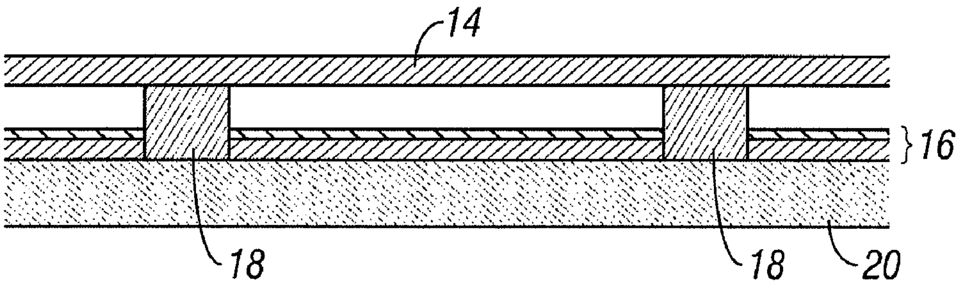
FIG. 7A is a cross section of the device of FIG. 1.
Figure 7B:
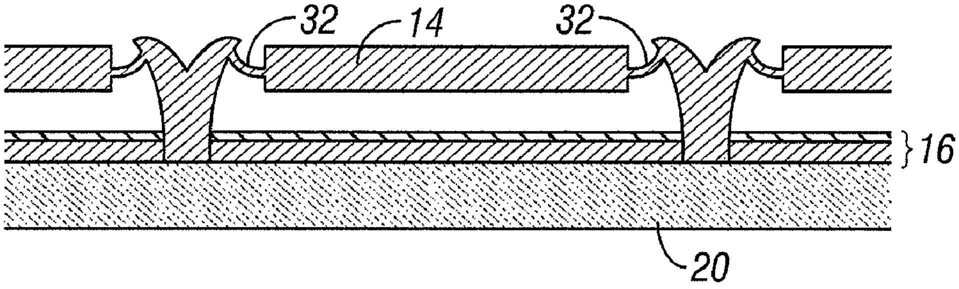
FIG. 7B is a cross section of an alternative embodiment of an interferometric modulator.
Figure 7C:
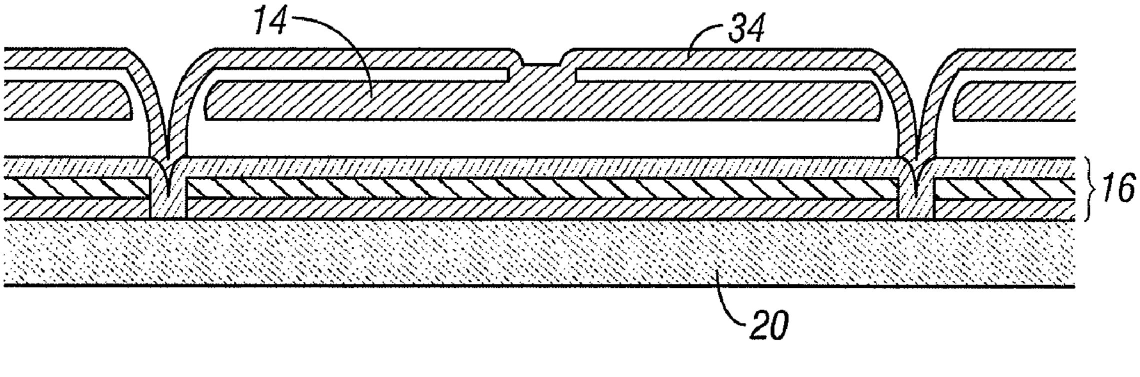
FIG. 7C is a cross section of another alternative embodiment of an interferometric modulator.
Figure 7D:
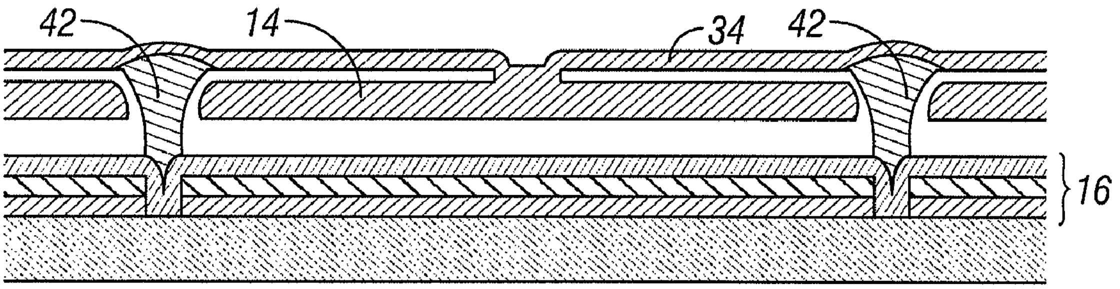
FIG. 7D is a cross section of yet another alternative embodiment of an interferometric modulator.
Figure 7E:
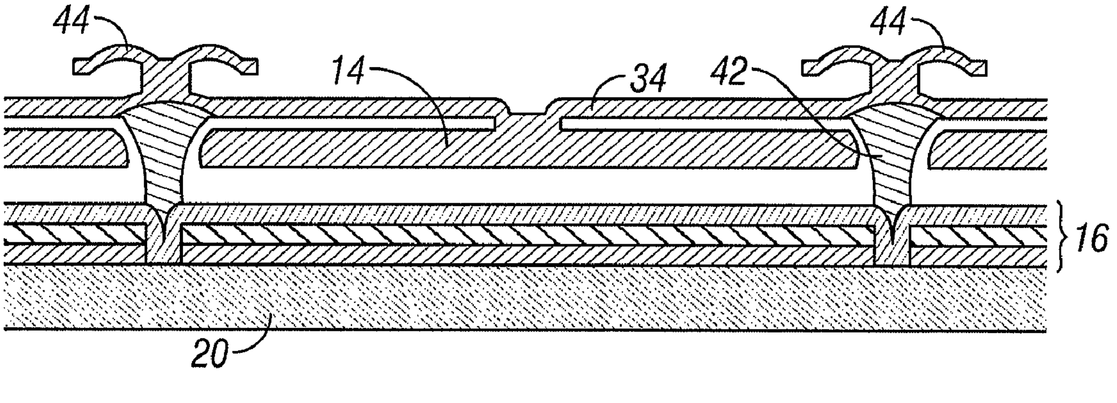
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 of each interferometric modulator is square or rectangular in shape and attached to supports at the corners only, on tethers 32. In FIG. 7C, the moveable reflective layer 14 is square or rectangular in shape and suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. For example, such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Placing Desiccant in the Package

Figure 8:
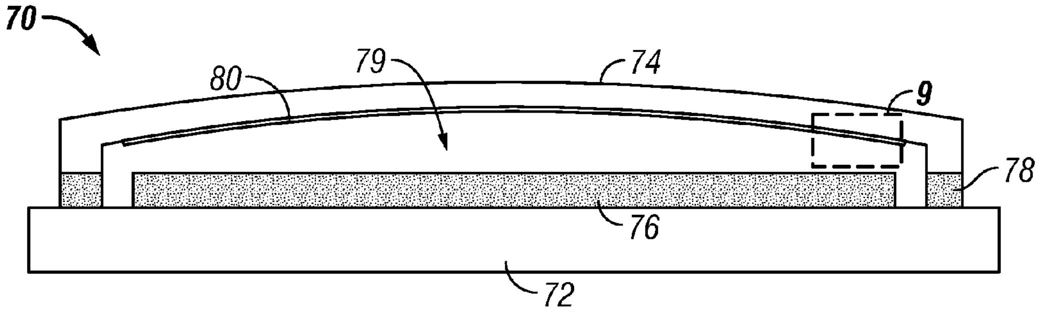
FIG. 8 is a cross-sectional view of an embodiment of an interferometric modulator with a desiccant fused with a backplate cover.
Figure 8A:
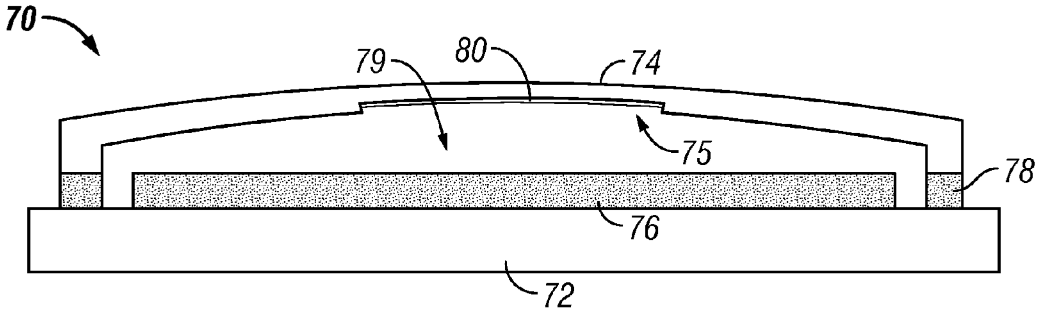
FIG. 8A is a cross-sectional view of an embodiment of an interferometric modulator with a desiccant fused into a recess of a backplate cover.

A schematic of a basic package structure for a MEMS device having integrated desiccant is illustrated in FIG. 8A. As shown in FIG. 8A, a basic package structure 70 includes a substrate 72 and a backplate cover or "cap" 74, wherein an interferometric modulator array 76 is formed on the substrate 72. This cap 74 is also called a "backplate".

The substrate 72 and the backplate 74 are joined by a seal 78 to form the package structure 70, such that the interferometric modulator array 76 is encapsulated by the substrate 72, backplate 74, and the seal 78. This forms a cavity 79 between the backplate 74 and the substrate 72. The seal 78 may be a non-hermetic seal, such as a conventional epoxy-based adhesive. In other embodiments, the seal 78 may be a polyisobutylene (sometimes called butyl rubber, and other times PIB), o-rings, polyurethane, thin film metal weld, liquid spin-on glass, solder, polymers, or plastics, among other types of seals that may have a range of permeability of water vapor of about 0.2-4.7 g mm/$m^2$kPa day. In still other embodiments, the seal 78 may be a hermetic seal.

Generally, it is desirable to minimize the permeation of water vapor into the package structure 70 and thus control the environment inside the package structure. Hermetically sealing the package, for example, can ensure the environment remains constant over the lifetime of the device. When the humidity within the package exceeds a level beyond which surface tension from the moisture becomes higher than the restoration force of a movable element (not shown) in the interferometric modulator, the movable element may become permanently stuck to the surface. Such stiction of movable membranes renders the device inoperable. In the case of an OLED device, moisture can cause corrosion of metal electrodes, rendering the device inoperable.

In the embodiment illustrated in FIG. 8A, the package structure 70 includes an impact sprayed desiccant 80 configured to reduce moisture within the cavity 79. In the embodiment illustrated in FIG. 8B, the package structure 70 includes a modified backplate 74. Backplate 74 may be sandblasted or chemically etched to create a backplate cavity 75. Using methods described in more detail below, desiccant 80 can then be selectively impact sprayed into the backplate cavity 75 to reduce moisture in the package cavity 79. The skilled artisan will appreciate that a desiccant may not be necessary for a hermetically sealed package, but may be desirable to control moisture resident within the package.

The substrate 72 may be a semi-transparent or transparent substance capable of having thin film, MEMS devices built upon it. Such transparent substances include, but are not limited to, glass, plastic, and transparent polymers. The interferometric modulator array 76 may comprise membrane modulators or modulators of the separable type. The skilled artisan will appreciate that the backplate 74 may be formed of any suitable material, such as glass, metal, foil, polymer, plastic, ceramic, or semiconductor materials (e.g., silicon).

In some embodiments of the package structure 70, the seal 78 includes an adhesive. The adhesive component alone may not act as a suitable environmental barrier because it eventually allows water vapor and/or contaminates to permeate into the cavity 79 of the package structure 70. Accordingly, certain embodiments of a package structure 70 include a getter inside the package structure 70 or incorporated into the seal 78. The getter may be configured to getter contaminant gases that are outgassed from the interferometric modulator array 76 or packaging components after the package structure 70 is assembled, such as substances outgassed or evaporated from an adhesive in the seal 78 into the cavity 79 while the adhesive is curing. The getter may be a chemically reactant getter configured to chemically react with specific substances. In some embodiments the getter is configured to getter substances such as contaminants that have permeated the seal 78 from the environment, substances outgassed or released from the seal 78 during manufacture or assembly, and substances within the cavity 79 of the package structure 70 that are present at the time of manufacture or assembly.

In other embodiments described in more detail below, a chemically reactant getter and desiccant are both provided inside the package structure 70 to getter water vapor and contaminant gases. The chemically reactant getter may include, for example, calcium oxide, strontium oxide, and aluminum complexes. In certain embodiments, one or more components of package structure 70, such as substrate 72, backplate 74, or seal 78, include a sufficient amount of getter to getter or capture substantially all of the substances outgassed or released from the sealant components during manufacture or assembly, such as substances outgassed from an adhesive material while curing.

The skilled artisan will understand that different materials capture water vapor and contaminants in different ways. A material like CaO, for example, can capture moisture irreversibly by chemisorption, whereby CaO is converted to calcium hydroxide. Zeolite material, on the other hand, can capture moisture reversibly in its microscopic pores by physisorption. The zeolite material can be thermally heated after it is delivered to the package structure 70, releasing the moisture in its pores and thus reactivating it to absorb water molecules again. Zeolite material can also be used to absorb different types of contaminant gases. For example, zeolite material of a particular pore size can be selected to capture a specific contaminant. Zeolite material with a pore size of approximately 3 angstroms may be used to capture water in the package structure, while zeolite material of 4 to 5 angstroms can capture methane, nitrogen, and/or carbon dioxide. Zeolite material with about 10 angstrom pore size can be selected to capture more complex molecules with longer chains.

The skilled artisan will also understand that the amount of desiccant material required in the packaged device depends on the initial moisture content in the packaged device, the outgassing potential of the package components, the size and lifetime of the device, and the rate at which moisture ingresses into the device. The amount of desiccant needed inside packaged devices also constrains the minimum thickness of the device, as sufficient room must be provided for the desiccant.

Figure 9:
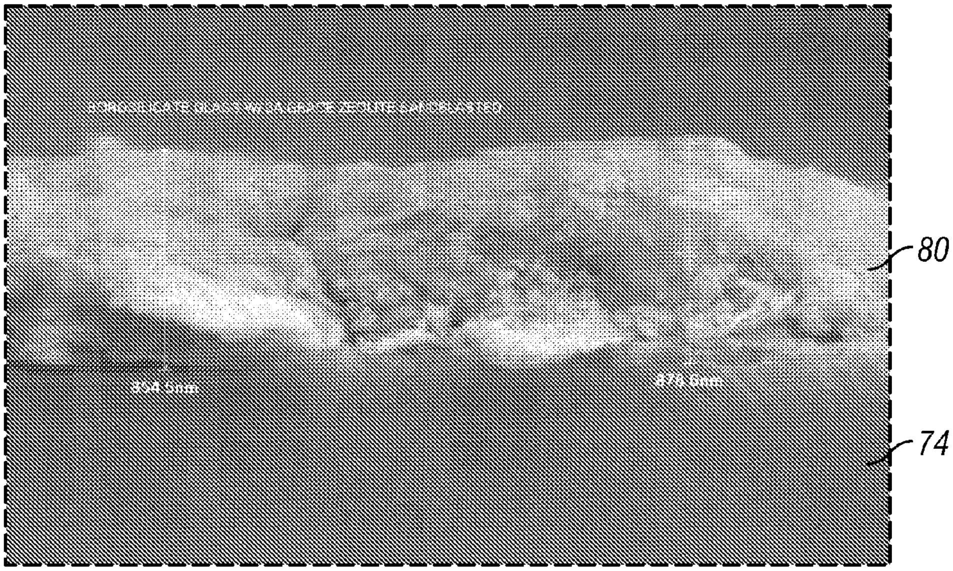
FIG. 9 is a scanning electron micrograph showing desiccant fused to a substrate.

FIG. 9 provides a scanning electron microscope image of a cross-section of backplate 74 with impact sprayed desiccant 80 fused onto the surface of backplate 74. In other embodiments, desiccant 80 is impact sprayed onto and fuses with substrate 72. In still other embodiments, the impact-sprayed surface is impregnated with desiccant 80.

Desiccants may be used for packages that have either hermetic or non-hermetic seals. In packages having a hermetic seal, desiccants are typically used to control moisture resident within the interior of the package. In packages having a non-hermetic seal, a desiccant may be used to control moisture moving into the package from the environment. Generally, any substance that can trap moisture while not interfering with the optical properties of the interferometric modulator array may be used as the desiccant 80. Suitable desiccant materials include, but are not limited to, zeolites, molecular sieves, surface adsorbents, bulk adsorbents, and chemical reactants.

In addition to being in solid form, the desiccant 80 may alternatively be in powder form. These powders may be mixed with an adhesive or binder to be applied in a matrix form, or, as will be described in more detail below, incorporated directly into the package in substantially pure form. In some embodiments, beads or pellets of desiccant 80 contain a suitable inorganic binder. One example of such a desiccant is Zeolite. Suitable inorganic binders include bentonite, layered silicates, MgO-based materials, and other inorganic clays having a low carbon content. Binders with low carbon content can provide advantages in that they typically do not outgas harmful organic compounds into the interior of the package. In embodiments described herein, beads of desiccant 80 include between approximately 10% to 60% inorganic binder. Such inorganic binders may be solvent- and surfactant-free. The beads can be micronized or pulverized to a desired particle size, such as 20 to 30 microns. This dry composition desiccant can then be incorporated directly into the package in substantially pure form by impact spraying, without the use of solvents or wetting or slurry agents, such as ethylene glycol or water. Persons of skill in the art will understand that ethylene glycol, commonly used to control the viscosity of wet desiccant slurries, can cause undesirable stiction of MEMS components.

The skilled artisan will understand that the desiccant 80 can be applied in different ways to fuse into a surface. As shown in FIG. 9, when the desiccant 80 is impact sprayed onto the backplate 74, the desiccant creates a thin uniform dry composition layer that fuses with and adheres to backplate 74. In some embodiments, desiccant 80 is impact sprayed with sufficient force to create a roughened surface across the backplate 74. This roughened surface allows more of the desiccant 80 to come in contact with any moisture in the package environment since a greater surface area of desiccant is provided. In addition, because substantially pure desiccant can be impact sprayed and adhered to the backplate 74, the ability of the desiccant to remove water is greater in comparison to desiccants that have been diluted with binders or other compounds used to attach the desiccant to a surface. The skilled artisan will also understand desiccant 80 can be applied to different surfaces in package 70, and to different portions of a surface. In the embodiment illustrated in FIG. 8A, for example, a cavity is first formed in backplate 74, then desiccant 80 is impact sprayed into the backplate cavity. In addition, the desiccant may be impact sprayed onto the transparent substrate or other components of the MEMS device.

Methods of modifying MEMS device surfaces to provide desiccant properties will now be described in more detail. In one embodiment illustrated in FIG. 10, desiccant 80 is fused with backplate 74 by impact spraying desiccant 80 onto backplate 74. Desiccant 80 is emitted from a pressurized spray nozzle 102 and physically impinges backplate 74 such that a thin layer of desiccant 80 is deposited onto and fused with backplate 74. Backplate 74 can be made of, but is not limited to, materials such as glass, metal, ceramic, plastics such as liquid crystalline polymers (LCPs), and transparent polymers. Desiccant 80 can be impact sprayed on other surfaces in package structure 70, such as substrate 72.

"Sandblasting" is a common method used for physically altering and removing material surfaces. Conventional sandblasting uses powders such as $SiO_2$ or $Al_2O_3$ to blast or abrade solid materials with a high pressure jet nozzle. These hard powder materials apply a large impact force to the target surface to etch the surface and remove material. Impact spraying as described herein shares characteristics with conventional sandblasting but does not abrade the surface so much as to compromise the strength of backplate 74 or make it more prone to breakage. For example, desiccant 80 is typically not as hard as conventional sandblasting materials and thus may result in less damage to the target surface. Impact spraying desiccant 80 onto backplate 74 therefore causes desiccant 80 to impinge backplate 74 with less abrasive force and to accumulate in a thin layer 90 on backplate 74. The impact spraying causes this accumulated thin layer of dry composition desiccant material to fuse onto or bind with backplate 74. In some embodiments, impact spraying dry desiccant 80 onto backplate 74 causes some etching or removal of a surface of the substrate material, in addition to causing the build-up of thin layer 90 of desiccant 80 on backplate 74.

Figure 10:
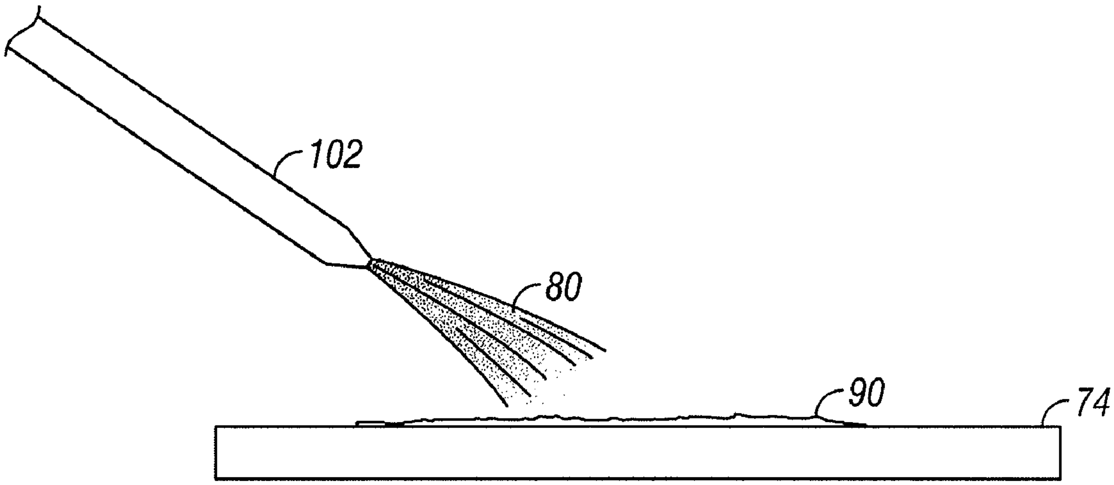
FIG. 10 is a side view of one embodiment of a method of fusing a desiccant to a backplate cover.

In the exemplary embodiment illustrated in FIGS. 9 and 10, impact spraying desiccant 80 onto backplate 74 causes the thin layer 90 to fuse with backplate 74. This fusion or permeation of desiccant 80 into backplate 74 may physically alter backplate 74 such that backplate 74 acts as a desiccant material within package structure 70.

Figure 11:
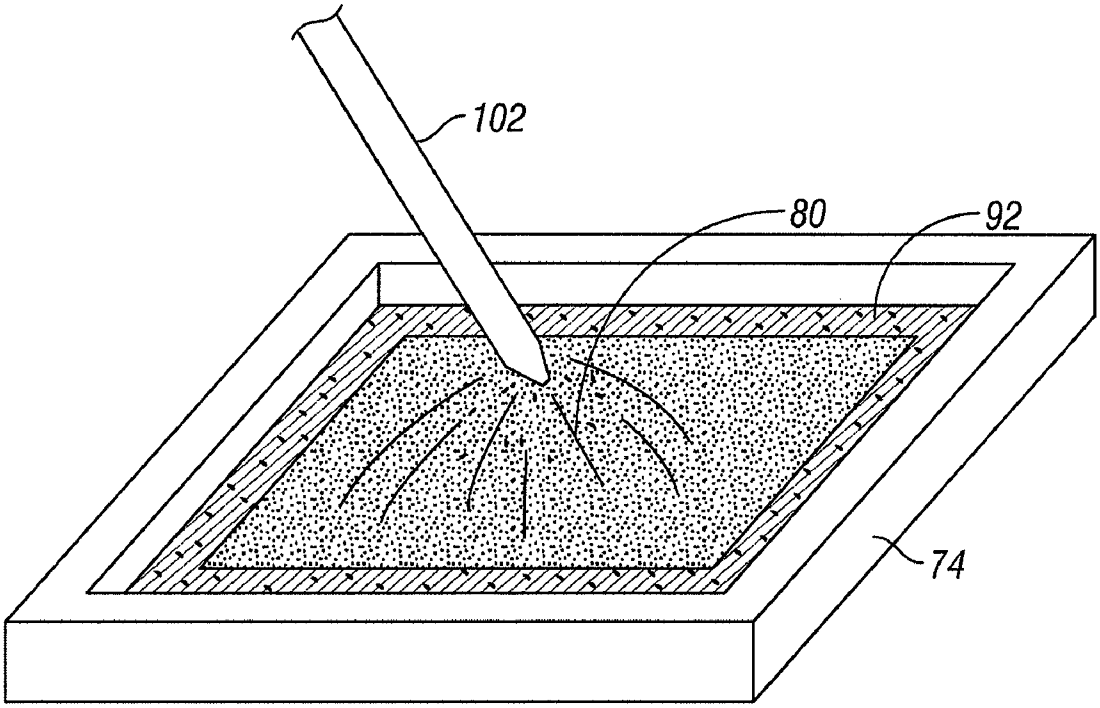
FIG. 11 is an isometric view depicting one embodiment of a method of fusing a desiccant to a backplate cover.
Figure 12:
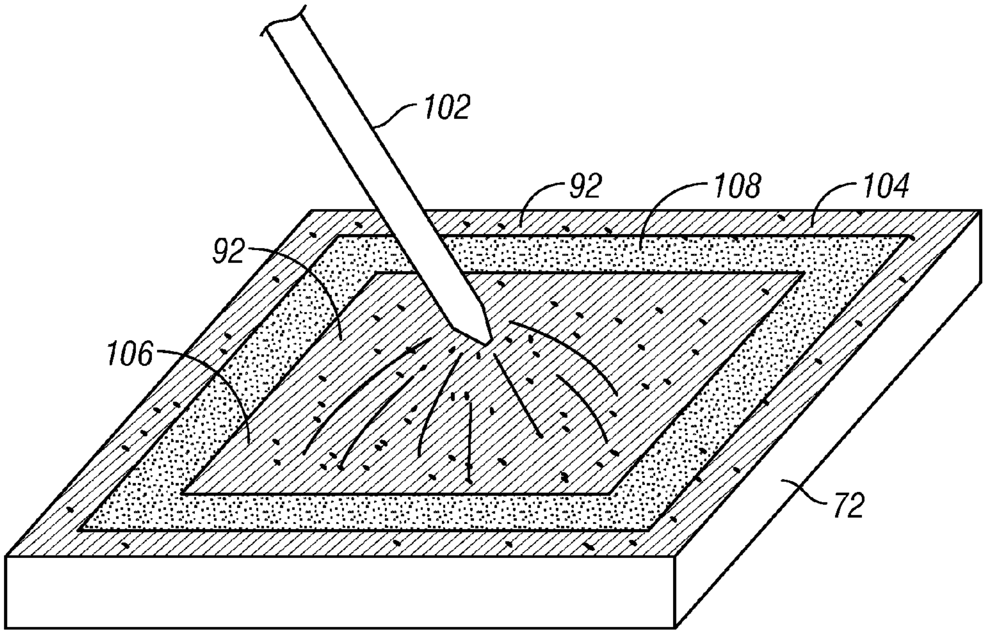
FIG. 12 is an isometric view depicting another embodiment of a method of fusing a desiccant to a substrate.

In one embodiment illustrated in FIG. 11, a mask 92 is positioned on a portion of backplate 74. Desiccant 80 is then impact sprayed onto backplate 74, resulting in desiccant 80 being fused onto the portion of backplate 74 not covered by mask 92. In another embodiment illustrated in FIG. 12, a mask 92 is positioned on a portion of substrate 72. The portion covered by mask 92 may, for example, comprise an area 104 of substrate 72 that lies outside seal 78. The portion covered by mask 92 may additionally comprise an area 106 of substrate 72 upon which a MEMS device is built. Desiccant 80 is then impact sprayed onto substrate 72, resulting in desiccant 80 being fused onto the portion of substrate 72 not covered by mask 92. Consequently, portion 108 of substrate 72 is coated with a thin layer of dry composition desiccant 80 and acts as a desiccant material inside package structure 70.

In yet another embodiment, backplate 74 is impact sprayed with desiccant 80 without the use of a mask 92. Because all or substantially all of backplate 74 that is encapsulated in package structure 70 can be impact sprayed with desiccant 80, changes in the electromechanical properties of the IMOD due to the presence of desiccant may be minimized or eliminated. Because the physical properties of all or substantially all of the backplate surface can be modified to act as a desiccant, the interferometric modulator array 76 does not sense the presence of desiccant in some regions and the absence of desiccant in others. The behavioral properties of interferometric modulator array 76 can thus be controlled and optimized in the presence of a desiccant.

Desiccant 80 can be advantageously impact sprayed on backplate 74 in pure or substantially pure form, resulting in significant moisture absorbing capability. Unlike patch or paste desiccants delivering 15 to 20% desiccant and 80 to 85% binder in matrix form, impact spraying desiccant 80 in pure or substantially pure form onto backplate 74 does not dilute the moisture-absorbing capability of the desiccant material. In one embodiment, desiccant 80 is 100% zeolite material without any binder. In another exemplary embodiment, a uniform, thin coating of zeolite material is applied to backplate 74 without an adhesive or binder. In another embodiment, desiccant 80 comprising 60 to 99% zeolite material is impact sprayed onto backplate 74.

In yet another embodiment, beads or pellets containing zeolite material and a suitable inorganic binder are first pulverized to a desired particle size, then the dry composition of pulverized desiccant is impact sprayed onto backplate 74. In some embodiments, the beads or pellets contain between approximately 40 percent to 90 percent zeolite material and between approximately 10 percent to 60 percent suitable inorganic binder.

The skilled artisan will understand that desiccant 80 is not limited to zeolite materials and any substance that can trap moisture while not interfering with the optical properties of the interferometric modulator array may be used as the desiccant 80. The skilled artisan will also understand that backplate 74 can be impact sprayed with a desiccant 80 comprising less than 60% zeolite or other moisture-absorbing material, and still result in backplate 74 acting as a desiccant material inside package structure 70.

Figure 13:
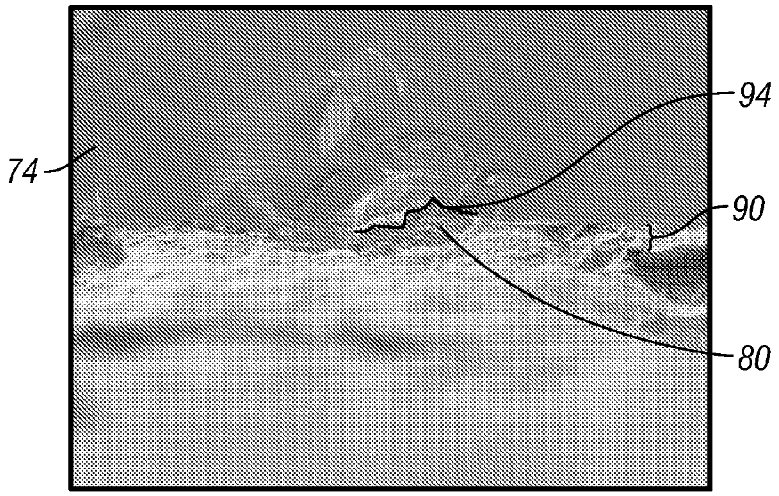
FIG. 13 is a scanning electron micrograph showing desiccant fused with a backplate cover.

As illustrated in FIG. 13, impact spraying desiccant 80 onto backplate 74 creates a thin, uniform layer of desiccant fused with backplate 74, including fusing with areas 94 in the surface of backplate 74. Where the surface of backplate 74 naturally includes areas 94, such areas can increase the surface area onto which desiccant 80 is impact sprayed, thus increasing the amount of desiccant 80 delivered into package structure 70. In other embodiments, the surface of backplate 74 is first etched to create more areas like area 94, then impact sprayed with desiccant 80, further increasing the amount of desiccant 80 delivered into package structure 70.

The skilled artisan will understand that the thickness of thin layer 90, and thus the amount of desiccant material in the packaged device, can be selected based on the initial moisture content in the packaged device, the size and lifetime of the device, and the rate at which moisture ingresses into the device. The ability to impact blast the entire surface of backplate 74 with desiccant 80, delivering desiccant 80 in pure or substantially pure form, and the effect of roughening backplate 74 to increase the surface area of thin layer 90 all result, individually and in combination, in increased moisture absorbing capability of desiccant 80. This increased moisture absorbing capability can minimize the required thickness of thin layer 90 needed to absorb moisture over the display device's operational lifetime. For example, impact spraying desiccant 80 onto backplate 74 to a thickness of 1 to 5 microns can result in the same moisture-absorbing capability as adhering a 40-200 micron thick patch or paste desiccant to backplate 74. In one embodiment, desiccant 80 is impact sprayed onto backplate 74 to a thickness of 0.5 to 5 microns.

Figure 14:
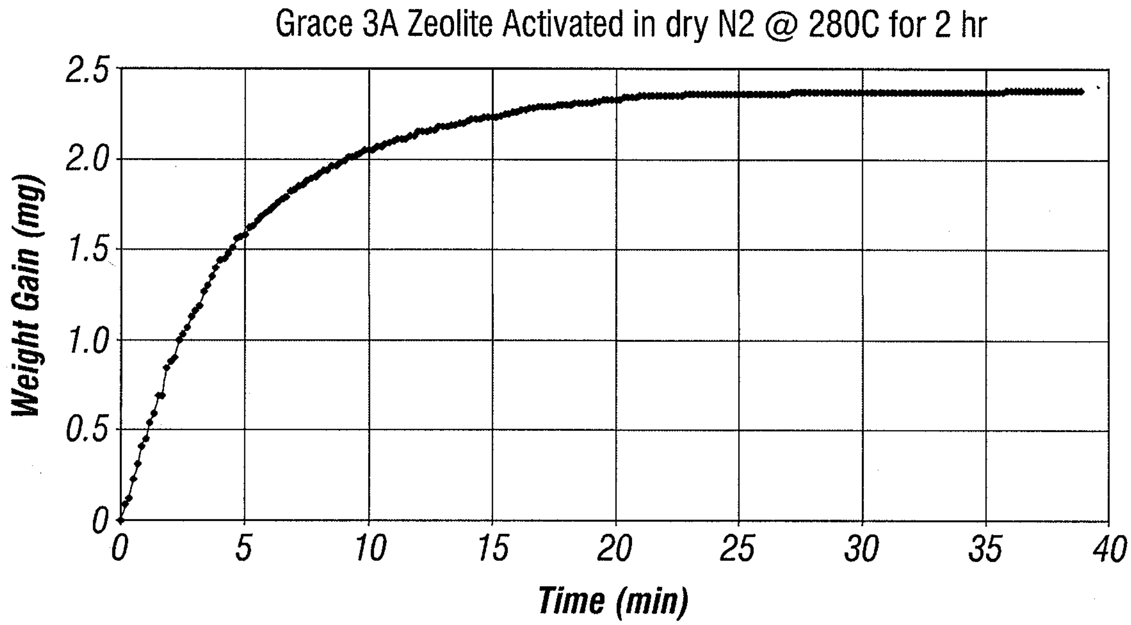
FIG. 14 is a line graph depicting water absorption of desiccant that is impact sprayed onto glass.

The graph shown in FIG. 14 illustrates the moisture absorbing capability of one embodiment of desiccant 80. Desiccant 80 comprising synthetic zeolite material having a pore size of approximately 3 angstroms is impact sprayed onto a glass surface to a thickness of approximately 1 micron. Desiccant 80 is then activated in a dry nitrogen atmosphere at 280° C. for two hours. The graph shown in FIG. 14 demonstrates the amount of water in milligrams absorbed by an approximately 1 micron-thick layer of desiccant 80.

This significant reduction in the required thickness of desiccant 80 allows the overall thickness of package structure 70 to be reduced significantly. Impact spraying desiccant 80 onto backplate 74 can also eliminate additional manufacturing steps and chemical contaminants associated with etching a cavity into backplate 74 to provide sufficient room for a patch or paste desiccant.

In exemplary embodiments, zeolite materials of different pore sizes are selected to capture both moisture and gas contaminants, then impact sprayed onto backplate 74. In one embodiment, zeolite material having a pore size of approximately three angstroms is provided to capture contaminants having diameters of less than three angstroms, such as water molecules in the package structure. In the same embodiment, zeolite material having a pore size greater than three angstroms is also provided to capture methane, nitrogen, and/or carbon dioxide. In an alternate embodiment, zeolite materials of different pore sizes are selected to absorb both water molecules and contaminant molecules, including solvents and hydrocarbons having a critical dimension of less than 10 angstroms.

In one embodiment, no less than 80% of desiccant 80 is zeolite material having a pore size that absorbs moisture. In another embodiment, no less than 80% of desiccant 80 is zeolite material having approximately 2 to 3 angstrom pore size. In yet another embodiment, no less than 80% of desiccant 80 is zeolite material having approximately 3 angstrom pore size. The remaining 20% of desiccant 80 can include zeolite materials with pore sizes configured to absorb materials other than moisture, such as contaminant gases. In another embodiment, no less than 90% of desiccant 80 is zeolite material having a pore size of approximately 2 to 3 angstroms. In another exemplary embodiment, 2 to 3% of desiccant 80 includes zeolite materials having pore sizes of 5 to 10 angstroms to capture contaminant gases outgassed by adhesives and/or binders inside package structure 70. In other exemplary embodiments, desiccant 80 includes zeolite material for capturing moisture and non-zeolite chemical getters for capturing contaminant gases. One of skill in the art will understand that as described herein, zeolite material may or may not include an inorganic binder.

In one embodiment, backplate 74 is impact sprayed with synthetic zeolite material. In another embodiment, backplate 74 is impact sprayed with natural zeolite material. In an exemplary embodiment, 80 to 90% of the synthetic or natural zeolite material has a pore size of approximately 2 to 3 angstroms and 10 to 20% of the zeolite material has a pore size greater than 3 angstroms. In other exemplary embodiments, desiccant 80 includes both synthetic and natural zeolite material.

The skilled artisan will understand that the specific conditions and parameters of impact spraying desiccant 80 can be changed and optimized to create a thin layer 90 of specific thickness. For example, the length of time backplate 74 is impact sprayed with desiccant 80 affects the thickness of layer 90. The height of nozzle 102 from backplate 74 can affect thickness of desiccant 80 and the uniformity of thin layer 90 on backplate 74. The pressure with which desiccant 80 is applied to backplate 74 can affect the degree to which desiccant 80 physically impinges and fuses with backplate 74, as well as the thickness of layer 90. Increasing the temperature of backplate 74 may also aid in the adhesion of desiccant particles to the surface. The morphology of desiccant 80 can also impact the creation and thickness of layer 90. For example, impact spraying backplate 74 with a desiccant 80 comprised substantially of 10-micron size particles may reduce the impact of desiccant 80 onto backplate 74, or the degree to which areas 94 are created. Thus, in one embodiment, the degree to which desiccant 80 fuses with backplate 74 is directly related to the power with which desiccant 80 impacts backplate 74.

The composition of desiccant 80 and any associated inorganic binder material can also affect the formation and thickness of layer 90. Desiccant 80 may include, for example, a suitable inorganic binder. Suitable binders include clays such as bentonite, layered silicates, MgO-based materials, and other inorganic clays having low propensity for carbon contamination. Table 1 shows data from an X-ray photoelectron spectroscopy (XPS) spectrum of an exemplary impact sprayed zeolite desiccant surface. As shown below, the carbon content of the desiccant is very low, being approximately 3%.

TABLE 1

| Component | Atomic % |
|---|---|
| Oxygen (O) | 62.9 |
| Silicon (Si) | 13.4 |
| Aluminum (Al) | 10.6 |
| Potassium (K) | 5.7 |
| Carbon (C) | 3.3 |
| Sodium (Na) | 2.7 |
| Calcium (Ca) | 1.4 |

The skilled artisan will understand that outgassing of vapor or contaminants inside the package structure 70 can cause stiction of the movable parts within the package, rendering the device inoperable. In some embodiments, desiccant 80 is combined with a suitable inorganic binder, then impact sprayed onto a surface. In other embodiments, commercially-available desiccant pellets or beads which already include a suitable inorganic binder are micronized or pulverized into a powder of desired particle size, then impact sprayed onto a surface. A suitable particle size is 20 to 30 microns in some embodiments. In exemplary embodiments using desiccant with a suitable inorganic binder, no observable outgassing of contaminants occurs after the combined desiccant and binder are impact sprayed onto the surface and the package structure 70 is sealed. In some embodiments, the reduction or elimination of organic outgassing vapor prevents or reduces the deposition of vapor on the movable membranes in the package structure 70.

The skilled artisan will also understand that as the size of display devices increases, the surface area of backplate 74 also increases, providing more surface area that can be impact sprayed with desiccant 80. This increased surface area of backplate 74 on which to provide desiccant 80 allows desiccant 80 to be applied in a thinner layer 90. The height of nozzle 102, the pressure with which desiccant 80 is blasted, and the morphology of desiccant 80 can be altered to decrease the thickness of layer 90. In one exemplary embodiment, the required thickness of layer 90 is reduced as the size of the display device and the surface area of backplate 74 increases.

In one embodiment, desiccant 80 is impact sprayed onto a substantially flat backplate 74, such as smooth glass. Such impact spraying may result in minor etching or removal of some material from backplate 74, in addition to the accumulation of a thin, uniform layer of desiccant 80 that is fused onto backplate 74. In other embodiments, impact spraying desiccant 80 does not result in etching of backplate 74 or removal of material from backplate 74. In another exemplary embodiment, the surface of backplate 74 is first roughened with low-impact spraying using conventional sandblasting techniques, then impact sprayed with desiccant 80.

In another embodiment, a method of manufacturing a display includes micronizing or pulverizing desiccant 80 into a powder of desired particle size, then subjecting a surface, such as but not limited to a backplane cover, to a flux of the pulverized desiccant particulates such that the desiccant is fused onto the surface. In some embodiments, the desiccant 80 is pulverized to a particle size of between 20 and 30 microns. In other embodiments, beads or pellets desiccant 80 include a suitable inorganic binder. The beads are crushed or pulverized to a particle size between approximately 20 and 30 microns, then impact sprayed onto a surface. In exemplary embodiments, desiccant 80 includes between approximately 10 percent to 60 percent binder.

The skilled artisan will also understand that certain MEMS devices operate best when the relevant contact surfaces are treated with an appropriate anti-stiction agent. An embodiment of desiccant 80, having between approximately 20 percent to 40 percent zeolite material of pore size 10 angstroms or larger, offers a controllable means of delivering appropriate anti-stiction agents including, but not limited to, fluorinated surfactants, silanes, chlorosilanes, and functionalized hydrocarbons. In one embodiment, desiccant 80 comprises 60 percent to 80 percent zeolite material having approximately 2 to 3 angstrom pore size and 20 percent to 40 percent zeolite material having approximately 10 angstrom pore size.

Persons of skill will also understand that the method of fusing a desiccant to a surface is not limited to the specific embodiments described herein. Some embodiments may use plasma spraying, also known as thermal spraying, to fuse desiccant 80 to backplate 74, for example. Dry, powdered desiccant as described herein can be introduced into a high-temperature plasma jet that emanates from a plasma torch. Plasma jets can reach temperatures on the order of 10,000 K. Desiccant 80 melts in the plasma jet and is propelled toward backplate 74. Upon impact, the molten droplets of desiccant flatten, rapidly solidify, and form a deposit. Like the thin, uniform coating of desiccant created by impact spraying, the deposit created by plasma spraying fuses with and adheres to backplate 74. Similar to impact spraying, several factors influence the thickness of the desiccant layer deposited on backplate 74. Such factors include the morphology and composition of desiccant 80, the composition and flow rate of the plasma gas, and the distance of the plasma torch from backplate 74.

Experiment 1

The moisture-absorbing capability of a conventional patch or paste desiccant was compared with the moisture-absorbing capability of the desiccant-treated backplate described herein. For example, a package structure containing a 150 micron thick desiccant patch absorbed 3 milligrams of water during the operational lifespan of the display device. A backplate was then impact sprayed with substantially pure 3 angstrom zeolite material to create a thin layer of pure zeolite material with thickness of 1 micron. The impact sprayed surface was cleaned with water and other cleaning agents, then baked in a dry environment to remove any resident moisture. The desiccant-treated backplate was then incorporated into an interferometric modulator package structure. The resulting glass backplate acted like an in-situ desiccant in the MEMS device, absorbing about 2.5 milligrams of water during the operational lifespan of the device.

Experiment 2

A mask was applied to a backplate, then the backplate was impact sprayed with a desiccant of pure zeolite material in powder form. After impact spraying, the backplate was washed with hot water to remove the mask. The backplate was then tested to determine the degree to which the desiccant fused to the backplate. The testing revealed no increase in contaminant particle count over package structures using conventional patch or paste desiccants. Further testing revealed the desiccant fused with the backplate to such a degree that the backplate remained a hard surface. Desiccant did not wash off of the backplate or release powder particles into the cavity during the display device's operational lifespan.

The skilled artisan will understand that the impact spraying method described herein is not limited to MEMS devices. The desiccant-treated surfaces described herein can be used in any display device susceptible to moisture or outgassing of binders or solvents, such as OLED or LCD devices. Further, the skilled artisan will understand that the desiccant treatment described herein is not limited to glass surfaces, but can be employed on such materials as, but not limited to, ceramics, polymers, and metals. It will be further understood that impact spraying is not limited to backplates, as any surface in the display package can be modified to act as a desiccant in the display package. The substrate 72 or seal 78 may be impact sprayed with desiccant material, for example.

Those of skill in the art would understand that the various illustrative logical blocks, modules, circuits, and algorithm steps described in connection with the embodiments disclosed herein may be implemented as electronic hardware, computer software, or combinations of both. The various illustrative components, blocks, modules, circuits, and steps have been described generally in terms of their functionality. Whether the functionality is implemented as hardware or software depends upon the particular application and design constraints imposed on the overall system. Skilled artisans recognize the interchangeability of hardware and software under these circumstances, and how best to implement the described functionality for each particular application. As examples, the various illustrative logical blocks, modules, circuits, and algorithm steps described in connection with the embodiments disclosed herein may be implemented or performed with a digital signal processor (DSP), an application specific integrated circuit (ASIC), a field programmable gate array (FPGA) or other programmable logic device, discrete gate or transistor logic, discrete hardware components such as, e.g., registers and FIFO, a processor executing a set of firmware instructions, any conventional programmable software module and a processor, or any combination thereof.

The processor may be a microprocessor, but in the alternative, the processor may be any conventional processor, controller, microcontroller, or state machine. The software module could reside in RAM memory, flash memory, ROM memory, registers, hard disk, a removable disk, a CD-ROM, or any other form of storage medium known in the art. Those of skill would further appreciate that the data, instructions, commands, information, signals, bits, symbols, and chips that may be referenced throughout the above description are represented by voltages, currents, electromagnetic waves, magnetic fields or particles, optical fields or particles, or any combination thereof.

The previous description of the preferred embodiments is provided to enable any person skilled in the art to make or use the disclosed embodiments. The various modifications to these embodiments will be readily apparent to those skilled in the art, and the generic principles defined herein may be applied to other embodiments without the use of the inventive faculty. Thus, the disclosed embodiments are not intended to be limited to the embodiments shown herein but is to be accorded the widest scope consistent with the principles and novel features disclosed herein.

What is claimed is:

1. An electronic device package, comprising:

a first substrate supporting an electronic device;

a backplate cover sealed to the first substrate to enclose the electronic device within a package; and an impact-sprayed desiccant fused onto at least a portion of the backplate cover or first substrate.

2. The device package of claim 1, wherein the impact-sprayed desiccant includes a substantially dry zeolite material.

3. The device package of claim 2, wherein the zeolite material has a pore size of approximately 3 angstroms.

4. The device package of claim 2, wherein the zeolite material has a pore size of between approximately 3 to 10 angstroms.

5. The device package of claim 1, wherein the backplate cover or first substrate includes a layer of impact-sprayed desiccant with a thickness between approximately 0.5 and 5.0 microns.

6. The device package of claim 1, wherein the impact-sprayed desiccant includes a first zeolite material having a pore size of approximately 3 angstroms and a second zeolite material having a pore size of between approximately 3 to 10 angstroms.

7. The device package of claim 6, wherein no less than approximately 60 percent of the impact-sprayed desiccant includes the first zeolite material.

8. The device package of claim 6, wherein the impact-sprayed desiccant includes between approximately 10 percent to 40 percent of the second zeolite material.

9. The device package of claim 6, wherein between approximately 60 percent to 80 percent of the impact-sprayed desiccant includes the first zeolite material, wherein between approximately 20 percent to 40 percent of the impact-sprayed desiccant includes the second zeolite material, and wherein the second zeolite material has a pore size of approximately 10 angstroms.

10. The device package of claim 9, wherein the second zeolite material includes at least one of a fluorinated surfactant, a silane, a chlorosilane, or a functionalized hydrocarbon.

11. The device package of claim 1, wherein the impact-sprayed desiccant includes between approximately 40 percent to 90 percent dry zeolite material and between approximately 10 percent and 60 percent dry inorganic binder.

12. The device package of claim 11, wherein the inorganic binder includes at least one of bentonite, silicate, magnesium oxide, and inorganic clay.

13. The device package of claim 1, wherein the impact-sprayed desiccant includes at least one of zeolite, molecular sieves, surface adsorbents, bulk adsorbents, and chemical reactants.

14. The device package of claim 1, wherein the impact-sprayed desiccant includes at least one of an inorganic oxide, a metal, and a phosphor.

15. The device package of claim 1, wherein the electronic device includes a display device.

16. The device package of claim 1, wherein the electronic device includes a MEMS device.

17. The device package of claim 1, wherein the display device includes an organic light emitting diode (OLED) device.

18. The device package of claim 1, wherein the display device includes an interferometric modulator display device.

19. The device package of claim 1, further comprising:

a display;

a processor that is configured to communicate with the display, said processor being configured to process image data; and a memory device that is configured to communicate with said processor.

20. The device package of claim 19, further comprising:

a driver circuit configured to send at least one signal to the display.

21. The device package of claim 20, further comprising:

a controller configured to send at least a portion of said image data to said driver circuit.

22. The device package of claim 19, further comprising:

an image source module configured to send said image data to said processor.

23. The device package of claim 22, wherein said image source module includes at least one of a receiver, transceiver, and transmitter.

24. The device package of claim 19, further comprising:

an input device configured to receive input data and to communicate said input data to said processor.

25. The device package of claim 1, wherein the at least a portion of the backplate cover or first substrate in contact with the impact-sprayed desiccant includes a roughened surface.

26. The device package of claim 25, wherein the roughened surface is the result of impact spraying the desiccant onto the at least a portion of the backplate cover or first substrate.

27. The device package of claim 1, wherein the at least a portion of the backplate cover or first substrate in contact with the impact-sprayed desiccant includes an etched surface.

28. The device package of claim 1, wherein the at least a portion of the backplate cover or first substrate is impregnated with the impact-sprayed desiccant.

29. A method of manufacturing an electronic device, comprising:

providing a first substrate supporting an electronic device;

providing a backplate cover;

impact spraying a desiccant to fuse the desiccant onto at least a portion of the backplate cover or first substrate; and joining the backplate cover to the first substrate to form a package enclosing the electronic device.

30. The method of claim 29, wherein the desiccant includes a substantially dry zeolite material.

31. The method of claim 29, further comprising providing a mask on the backplate cover for selectively impact spraying a portion of the backplate cover with the desiccant.

32. The method of claim 29, wherein impact spraying the desiccant includes impact spraying the desiccant onto at least a portion of the backplate cover or the first substrate with a thickness between approximately 0.5 and 5.0 microns.

33. The method of claim 29, wherein the electronic device includes a MEMS device.

34. The method of claim 29, wherein the electronic device includes an interferometric modulator (IMOD) array.

35. The method of claim 29, wherein the electronic device includes an organic light emitting diode (OLED) device.

36. The method of claim 29, wherein the electronic device includes a cellular telephone.

37. The method of claim 29, wherein the electronic device includes a display device.

38. An electronic display, comprising:

means for supporting a display device;

means for covering the display device joined to the supporting means to form a package enclosing the display device; and means for desiccating the package, wherein the desiccating means includes impact-sprayed desiccant that is fused onto the covering means.

39. The electronic display of claim 38, wherein the supporting means includes a transparent substrate.

40. The electronic display of claim 38, wherein the covering means includes a backplate.

41. The electronic display of claim 38, wherein the impact-sprayed desiccant includes zeolite.

42. A surface including impact-sprayed desiccant fused onto at least a portion of the surface.

43. The surface of claim 42, wherein the surface is sealed to a second surface to form a package, and wherein the impact-sprayed desiccant is fused to the surface inside the package.

44. The surface of claim 42, wherein the impact-sprayed desiccant is zeolite.

45. The surface of claim 42, wherein the surface includes a glass surface.

46. A method of fusing desiccant to a surface, comprising:

providing a surface; and impact spraying desiccant onto the surface, wherein the desiccant becomes fused to the surface.

47. The method of claim 46, wherein the surface is glass.

* * * * *

UNITED STATES PATENT AND TRADEMARK OFFICE

CERTIFICATE OF CORRECTION

PATENT NO. : 8,410,690 B2
APPLICATION NO. : 12/371302
DATED : April 2, 2013
INVENTOR(S) : Natarajan et al.

It is certified that error appears in the above-identified patent and that said Letters Patent is hereby corrected as shown below:

In the Specification

In column 1 at line 14, change “and or” to --and/or--.

In column 7 at line 10, change “respectively Relaxing” to --respectively. Relaxing--.

In column 8 at line 35, change “one ore more” to --one or more--.

In the Claims

In column 21 at line 1, in Claim 25, change “an electronic device,” to --a device,--.

Signed and Sealed this
First Day of October, 2013

Teresa Stanek Rea
*Deputy Director of the United States Patent and Trademark Office*